(12) United States Patent
Kraus

(10) Patent No.: US 8,821,778 B2
(45) Date of Patent: Sep. 2, 2014

(54) METHOD FOR ENCAPSULATING ELECTRICAL AND/OR ELECTRONIC COMPONENTS IN A HOUSING

(76) Inventor: Hilmar Kraus, Frankfurt am Main (DE)

( * ) Notice: Subject to any disclaimer, the term of this patent is extended or adjusted under 35 U.S.C. 154(b) by 1143 days.

(21) Appl. No.: 12/197,699

(22) Filed: Aug. 25, 2008

(65) Prior Publication Data

US 2009/0120685 A1    May 14, 2009

(51) Int. Cl.
*B29C 39/10* (2006.01)
(52) U.S. Cl.
USPC ............ 264/272.17; 264/272.13; 264/272.14; 264/272.15; 264/273; 264/274; 264/275; 264/263
(58) Field of Classification Search
None
See application file for complete search history.

(56) References Cited

U.S. PATENT DOCUMENTS

| 5,134,773 | A | * | 8/1992 | LeMaire et al. | ................ | 29/827 |
| 5,833,903 | A | * | 11/1998 | Centofante | .................. | 264/155 |
| 5,855,924 | A | * | 1/1999 | Lumbard | ...................... | 425/116 |
| 6,635,209 | B2 | * | 10/2003 | Huang | .......................... | 264/154 |
| 2002/0190429 | A1 | * | 12/2002 | Bolken | .................... | 264/272.11 |

FOREIGN PATENT DOCUMENTS

| DE | 892 947 C | 10/1953 |
| DE | 1136 100 C | 9/1962 |
| DE | 1912635 | 9/1970 |
| DE | 44 07 782 A1 | 9/1995 |
| DE | 10047644 | 6/2001 |
| DE | 10130517 | 1/2003 |
| JP | 9 046072 A | 2/1997 |

* cited by examiner

*Primary Examiner* — Edmund H. Lee
(74) *Attorney, Agent, or Firm* — John Alumit

(57) ABSTRACT

The invention relates to a method for encapsulating electrical and/or electronic components in a housing, the components being arranged on a printed circuit or a strip conductor in an assembly. Said assembly is positioned in the housing and is encapsulated with a curing, electrically insulating molding compound. The method according to the invention is characterized by encapsulating preferably in a molding chamber at a pressure below atmospheric pressure and by removing the negative pressure after encapsulation and before curing.

12 Claims, No Drawings

METHOD FOR ENCAPSULATING ELECTRICAL AND/OR ELECTRONIC COMPONENTS IN A HOUSING

CROSS-REFERENCE TO RELATED APPLICATION

This application claims the benefit of the priority filing date of international application no. PCT/DE2007/000147, and German application no. (DE) 10 2006 009 120.5 filed on Feb. 24, 2006.

FEDERALLY SPONSORED RESEARCH

Not Applicable

SEQUENCE LISTING OR PROGRAM

Not Applicable

STATEMENT REGARDING COPYRIGHTED MATERIAL

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND

The invention concerns a method for encapsulating electrical and/or electronic components in a housing, the components being arranged on a printed circuit or a strip conductor in an assembly, and the assembly is positioned in the housing and is encapsulated with a curing, an electrically insulating molding compound.

The method in question can be used to manufacture any desired electrical or electronic assemblies in a housing. For example, these can be network parts or network modules that are resistant to environmental factors such as submergence and fouling, shock, vibration, etc. However, it should be emphasized here that this can involve any electrical and/or electronic components or assemblies in a housing, and the encapsulation not only provides a sealing against the surroundings, but also, in particular, an electrical insulation within the assembly. Based on such an encapsulation, it is possible to place the electrical and/or electronic components as close together as possible on the integrated circuit or strip conductor, thereby enabling a further miniaturization of the corresponding assemblies.

The above mentioned method is already rather well known from practice, the method being used at atmospheric pressure. In this case, one cannot rule out that the encapsulation contains air bubbles, so that a comprehensive electrical insulation of the individual components is not assured. Moreover, the molding compound does not reach all components, so that one cannot assure a satisfactory embedding and insulation of the components.

Furthermore, electrolytic capacitors have a tendency to outgas during operation and when exposed to heat. If such electrolytic capacitors are not totally encapsulated, or if they are surrounded by air bubbles, the assembly may become damaged and thus malfunction.

The basic problem of the present invention is therefore to organize and modify a method of the kind described above so that the aforementioned problems do not occur, or occur only in an extremely limited extent. The above indicated problem is solved by a method with the features of patent claim 1. Accordingly, the method is characterized such that the encapsulating preferably takes place in a molding chamber at a pressure below atmospheric pressure and the negative pressure is removed after encapsulation and before curing.

SUMMARY

The invention concerns a method for encapsulating electrical and/or electronic components in a housing, the components being arranged on a printed circuit or a strip conductor in an assembly, and the assembly is positioned in the housing and is encapsulated with a curing, an electrically insulating molding compound.

The method in question can be used to manufacture any desired electrical or electronic assemblies in a housing. For example, these can be network parts or network modules that are resistant to environmental factors such as submergence and fouling, shock, vibration, etc. However, it should be emphasized here that this can involve any electrical and/or electronic components or assemblies in a housing, and the encapsulation not only provides a sealing against the surroundings, but also, in particular, an electrical insulation within the assembly. Based on such an encapsulation, it is possible to place the electrical and/or electronic components as close together as possible on the integrated circuit or strip conductor, thereby enabling a further miniaturization of the corresponding assemblies.

A device for the thermoselective encapsulation of electrical and/or electronic components in a housing is also the subject of this invention, wherein the components are arranged on a printed circuit or a strip conductor in an assembly, and wherein the assembly is positioned in the housing and is encapsulated with a curing, electrically insulating molding compound.

DESCRIPTION

According to the invention, it has been discovered that the above-mentioned problems are largely eliminated when the encapsulation occurs under a pressure below atmospheric pressure. To this end, the encapsulation can take place in a vacuum molding chamber. After the encapsulation with molding compound, the negative pressure is removed, so that the molding compound is properly drawn into the evacuated interstices between the electrical and/or electronic components in the housing. In this way, the formation of air bubbles in the molding compound is largely avoided. Furthermore, the aforementioned method of the invention can ensure that the electrical and/or electronic components are surrounded entirely by the molding compound, so that direct electrical insulation of the individual components is produced. Thus, the components can be placed more closely to each other—as a result of the special electrical insulation between the components due to the molding compound. Close packing densities and layers of printed circuits are feasible.

Furthermore, it is best when the assembly is provided with flow pathways or flow channels for the molding compound prior to the encapsulation. These flow pathways or flow channels would ensure that the molding compound can get in everywhere, even into regions between the inner wall of the housing and the components, or the assembly, from the open side of the assembly. The flow pathways or flow channels can be fashioned in the form of passageways or boreholes in the printed circuit or strip conductor, and these passageways should be provided wherever the arrangement of the electrical and/or electronic components allows, especially wherever the molding compound can only reach with difficulty or not at all. Finally, it is conceivable for the printed circuit to be properly perforated—wherever the perforation does not hinder the current flow and especially where components are arranged that need to be encapsulated or insulated to a special degree.

In regards to creating an especially strong adhesion of the molding compound to the electrical and/or electronic components, and to the housing, it is best to heat the assembly, and to dry it, prior to the encapsulation—if possible, along with the housing. The temperature treatment required for this can take place in the range between 50° C. to around 80° C., preferably at around 70° C. Furthermore, it is better if this temperature treatment takes place for a period of 20 to 40 minutes, preferably for 30 minutes. The temperature treatment takes place best in a drying cupboard, from which the assemblies inserted into the housing are taken (along with the housing) to a molding chamber. It is likewise conceivable for the molding chamber to be a temperature-controlled molding chamber, which serves at the same time as a drying cupboard.

In a preferred embodiment, the assembly is brought up to an encapsulation temperature prior to the encapsulation, assuming that the assembly previously subjected to the temperature treatment is cooled down, or cools down by virtue of the ambient temperature alone. The encapsulation of the molding compound occurs at an encapsulation temperature of around 30° C. to 40° C. It is best that the assembly, plus housing and molding compound, have roughly the same temperature during the encapsulation. Furthermore, one should ensure that little surface tension is produced between the molding compound and the assembly, or the housing, so that there is sufficiently good adhesion in the cooled-down state.

In a preferred embodiment, one should use a molding compound with high thermal conductivity, so that there is sufficiently good heat transfer to the surface of the housing, and to the free surface, during operation of the assembly, i.e., in the encapsulated state. It is also conceivable for the housing to be provided or outfitted with heat exchange elements. These can be integral components of the housing.

Any suitable materials can be considered for the molding compound, such as a two-component molding resin. The components of the molding resin are mixed as homogeneously as possible prior to encapsulation. A continuous mixing is possible or conceivable, especially for automatic or semiautomatic production. The mixture is prepared preferably by a mixing tube and possibly a casting valve for the encapsulation. A process control computer can dictate the mix ratio of the components and/or the required amount of molding resin to be dispensed. This would be in accordance with the required amount of molding compound per unit.

As already mentioned above, the molding compound should be heated to a suitable temperature prior to the encapsulation, or during the encapsulation, and a process temperature of around 30° C. to around 40° C. proves to be advantageous. In an especially ingenious manner, it is of further advantage if the molding compound is poured into the housing while it is at least slightly tilted. By this simple step, the molding compound will tend to flow behind and around the entire assembly. It is recommended to tilt the housing by around 5° to 15°, preferably by 6° to 10°, for the pouring.

For an all-around sealing and homogeneous encapsulation, it is best to wait a bit after pouring out a first molding quantity until the molding compound has distributed itself sufficiently well in the housing around the components of the assembly. Especially when the housing is tilted, the pouring could be done up to the lowest situated upper margin of the housing, and it is conceivable that the molding compound will at least slightly contract upon curing. A subsequent additional pouring is then required and advantageous.

It has already been mentioned that the encapsulation is done at a pressure below the atmospheric pressure. It is accordingly advantageous to perform the encapsulation in a vacuum chamber at a negative pressure of around 0.9 bar to 0.8 bar. Thus, the molding compound is poured into the housing at negative pressure, and the entire assembly is placed into the housing. After pouring, the vacuum chamber is ventilated, so that the molding compound is properly drawn into the housing—due to the prevailing negative pressure. This considerably facilitates the pouring of the molding compound and prevents the formation of bubbles during the pouring or shortly thereafter.

The ventilating of the vacuum chamber can be done all at once or in stages until the negative pressure is fully eliminated. It should be adapted to the viscosity of the molding compound.

A following step is conceivable, in which the housing is preferably positioned, at least for the most part, horizontally in a warming cupboard. There, or immediately after the first pouring, an additional quantity of molding compound can be poured in. This additional quantity of molding compound should be poured in just up to beneath the upper edge of the housing, preferably up to around 1 mm beneath the upper edge. It should be noted here that a one-time pouring is also conceivable, in which a horizontal positioning of the housing should be implemented during the pouring.

Next, the poured molding resin is cured at an ambient temperature of around 50° C. to 80° C., preferably at around 70° C. The curing would best take place in a warming cupboard. The vacuum chamber can also be configured at the same time as a warming cupboard.

To dispense with a separate warming cupboard, it is advisable to provide a sufficiently long temperature treatment period for the curing, namely, over a period of around 3 to 5 hours, preferably in the space of 4 hours. If the curing takes place at room temperature, a curing time of up to 12 hours or even more is required.

After the above-described curing, a further filling of the housing with molding compound can occur, by which one can achieve a so-called "full encapsulation with surface sealed flush," i.e., up to the upper edge of the housing. The full encapsulation should have the least possible thickness, for example, not more than 1 mm, in order to avoid a further contraction of the molding compound.

A final hardening is carried out in the range of 24 to 72 hours, especially in the range of around 48 hours. The final curing can be done at room temperature, or slight temperature control, so that a sufficiently good adhesion of the molding compound to the inner wall of the housing (and also to the components) is provided.

Besides the above discussed method, a device for the thermoselective encapsulation of electrical and/or electronic components in a housing is claimed, wherein the components are arranged on a printed circuit or a strip conductor in an assembly, and wherein the assembly is positioned in the housing and is encapsulated with a curing, electrically insulating molding compound. The device in particular makes use of a method according to one of patent claims 1 to 33. The essence of the invention is that the encapsulating preferably takes place in a molding chamber at a pressure below atmospheric pressure and the negative pressure is removed after encapsulation and before the curing. Preferred embodiments are given in the dependent patent claims 2 to 33, which are to be viewed not only in relation to the invented method but also in relation to the invented device, especially in combination with the features of patent claim 34, and are so claimed.

Furthermore, a thermoselectively encapsulated assembly is claimed, which consists of electrical and/or electronic components and is arranged in a housing. The components are arranged on a printed circuit or a strip conductor in the assembly, and the assembly is positioned in the housing and is encapsulated with a curing, electrically insulating molding compound. The thermoselectively encapsulated assembly can be produced by a method according to patent claims 1 to 33 and/or with a device according to patent claim 34. The features of patent claim 35 are to be viewed in combination with the features of patent claims 1 to 34, and especially also in relation to the configuration of the thermoselectively encapsulated assembly, as is claimed with patent claim 35.

What is claimed is:

1. A method for casting electrical and/or electronic components in a housing, wherein the components are placed on a printed circuit or a strip conductor in an assembly, wherein the assembly is positioned in the housing and casted with a curing, electrically insulating cast material, and wherein the casting occurs in a casting chamber at a pressure below atmospheric pressure, the method comprising the steps of:
   providing flow pathways or flow channels for the cast material in the assembly prior to the casting,
   fashioning the flow pathways or flow channels in the form of boreholes perforating the printed circuit, and
   raising the low pressure in stages after the casting and before the curing, until the low pressure is removed completely.

2. The method of claim 1, characterized in that before casting, the assembly is heated, and dried, whereby heat treatment occurs from about 50° C. to about 80° C., over a period from about 20 to 40 minutes, for example in a drier cabinet.

3. The method of claim 1, characterized in that prior to casting the assembly is brought to a casting temperature, is cooled and/or that the cast material is cast at a casting temperature of about 30° C. to 40° C., whereby during the casting, the assembly along with the housing and the cast material has the same temperature.

4. The method of claim 1, characterized in that a two-component cast resin is used as the cast mass, whereby the components of the cast resin are mixed homogeneously prior to casting, whereby the components are continuously mixed and the mixture is made ready for casting via a mixing tube and if necessary a casting valve, and/or whereby by means of a process computer, the mixing ratio of the components and/or the particular required dosing amount of cast resin are pre-set.

5. The method of claim 1, characterized by the fact in that prior to casting, or during casting, the casting material is heated from about 30° C. to about 40° C.

6. The method of claim 1, characterized in that, the housing is tipped to an angle from about 5° to about 15° while the cast material is poured into the housing.

7. The method of claim 1, characterized in that after the casting of a first filling amount, a pause takes place until the cast mass has been sufficiently well distributed around the components of the assembly, and/or that the housing has been cast down to the lowest-lying edge of the housing.

8. The method of claim 1, characterized in that the casting occurs in a vacuum chamber at a reduced pressure of 0.9 bar to 0.8 bar, whereby after casting, the vacuum chamber is ventilated and whereby the ventilation occurs in stages until the reduced pressure has been fully raised.

9. The method of claim 1, characterized in that the housing is positioned nearly horizontally, at least, in a heating chamber and/or that after the first casting a further quantity of cast mass is cast up to below the upper edge of the housing, to about 1 mm above the upper edge.

10. The method of claim 1, characterized in that the cast resin is cured at an ambient temperature from about 50° C. to about 80° C., whereby the curing occurs in a heating chamber and/or whereby the thermal treatment for the curing lasts about three to twelve hours.

11. The method of claim 1, characterized in that after curing, the housing is again filled with cast mass as specular casting up to the upper edge of the housing, whereby the specular casting has a maximum thickness of 1 mm.

12. The method of claim 1, characterized in that a final curing occurs in a range of 24 hours to 72 hours, whereby the final curing takes place at room temperature.

* * * * *